United States Patent
Jung et al.

(10) Patent No.: US 9,627,041 B1
(45) Date of Patent: Apr. 18, 2017

(54) MEMORY WITH A VOLTAGE-ADJUSTMENT CIRCUIT TO ADJUST THE OPERATING VOLTAGE OF MEMORY CELLS FOR BTI EFFECT SCREENING

(71) Applicant: QUALCOMM Incorporated, San Diego, CA (US)

(72) Inventors: Chulmin Jung, San Diego, CA (US); Fahad Ahmed, San Diego, CA (US); Sei Seung Yoon, San Diego, CA (US); Keejong Kim, Phoenix, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/010,385

(22) Filed: Jan. 29, 2016

(51) Int. Cl.
*G11C 11/00* (2006.01)
*G11C 11/419* (2006.01)
*G11C 5/14* (2006.01)
*G11C 11/4074* (2006.01)

(52) U.S. Cl.
CPC ............ *G11C 11/419* (2013.01); *G11C 5/147* (2013.01); *G11C 11/4074* (2013.01)

(58) Field of Classification Search
CPC ... G11C 11/413; G11C 5/147; G11C 11/4074; G11C 11/412; G11C 5/14; G11C 5/145; G11C 11/419

USPC ............................ 365/154, 156, 189.09, 226
See application file for complete search history.

(56) References Cited

U.S. PATENT DOCUMENTS

| 6,876,573 | B2 * | 4/2005 | Higeta ................. G11C 11/417 365/154 |
| 7,009,905 | B2 | 3/2006 | Aipperspach et al. |
| 7,450,452 | B2 | 11/2008 | Rosal et al. |
| 7,872,930 | B2 | 1/2011 | Chen et al. |
| 8,432,760 | B2 | 4/2013 | Deng et al. |
| 8,611,166 | B2 * | 12/2013 | Shinozaki ............. G11C 11/413 365/189.11 |
| 2012/0096323 | A1 | 4/2012 | Tachibana |

* cited by examiner

*Primary Examiner* — David Lam
(74) *Attorney, Agent, or Firm* — Arent Fox LLP

(57) ABSTRACT

A memory and a method to operate the memory are provided. The memory includes a plurality of memory cells and a wordline driver configured to output a wordline. The memory cells are coupled to the wordline. A control circuit is configured to supply an operating voltage to the memory cells and to the wordline driver. A voltage-adjustment circuit is configured to adjust the operating voltage supplied to the memory cells during the control circuit supplying the operating voltage to the memory cells and to the wordline driver. The method includes supplying an operating voltage to at least one memory cells and to a wordline coupled to the at least one memory cells and adjusting the operating voltage supplied to the at least one memory cells during the supplying the operating voltage to the at least one memory cells and to the wordline.

26 Claims, 8 Drawing Sheets

MEMORY WITH A VOLTAGE-ADJUSTMENT CIRCUIT TO ADJUST THE OPERATING VOLTAGE OF MEMORY CELLS FOR BTI EFFECT SCREENING

BACKGROUND

Field

The present disclosure relates generally to memories, and more particularly, a memory operating a memory cell screen for BTI effect.

Background

Modern electronic devices (such as cell phones, smart watches, etc.) rely heavily on electronic circuits built from field effect transistors (FETs). Such FETs may include p-channel transistors (e.g., p-type metal-oxide-semiconductor or PMOS transistors) and n-channel transistors (e.g., n-type metal-oxide-semiconductor or NMOS transistors).

The electronic circuits built from these p-channel transistors and n-channel transistors are susceptible to the negative-bias temperature instability (NBTI or more generally, BTI) effect. BTI causes the threshold voltages ($V_{TH}$) of the p-channel transistors and n-channel transistors to shift over time. For example, a $V_{TH}$ of a p-channel transistor subject to the BTI effect may rise up to 50 mV over time. A memory built from these devices may experience random fails as the $V_{TH}$ of the p-channel transistors shifts and rises.

Accordingly, there is a need for a stress mode of the memory to screen out weaker memory cells that are particularly susceptible to the BTI effect.

SUMMARY

Aspects of a memory are disclosed. The memory includes a plurality of memory cells and a wordline driver configured to output a wordline. The memory cells are coupled to the wordline. A control circuit is configured to supply an operating voltage to the memory cells and to the wordline driver. A voltage-adjustment circuit is configured to adjust the operating voltage supplied to the memory cells during the control circuit supplying the operating voltage to the memory cells and to the wordline driver.

Aspects of a method to operate a memory are disclosed. The method includes supplying an operating voltage to at least one memory cell and to a wordline coupled to the at least one memory cell and adjusting the operating voltage supplied to the at least one memory cell during the supplying the operating voltage to the at least one memory cell and to the wordline.

Further aspects of a memory are disclosed. The memory includes a plurality of memory cells and a wordline driver configured to output a wordline. The memory cells are coupled to the wordline. The memory further includes a first power rail and a second power rail. A voltage supply circuit is configured to supply an operating voltage to the memory cells via the first power rail and to the wordline driver via the second power rail. A voltage-adjustment circuit is coupled to the first power rail to adjust the operating voltage supplied to the memory cell in accordance with a target threshold voltage shift.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
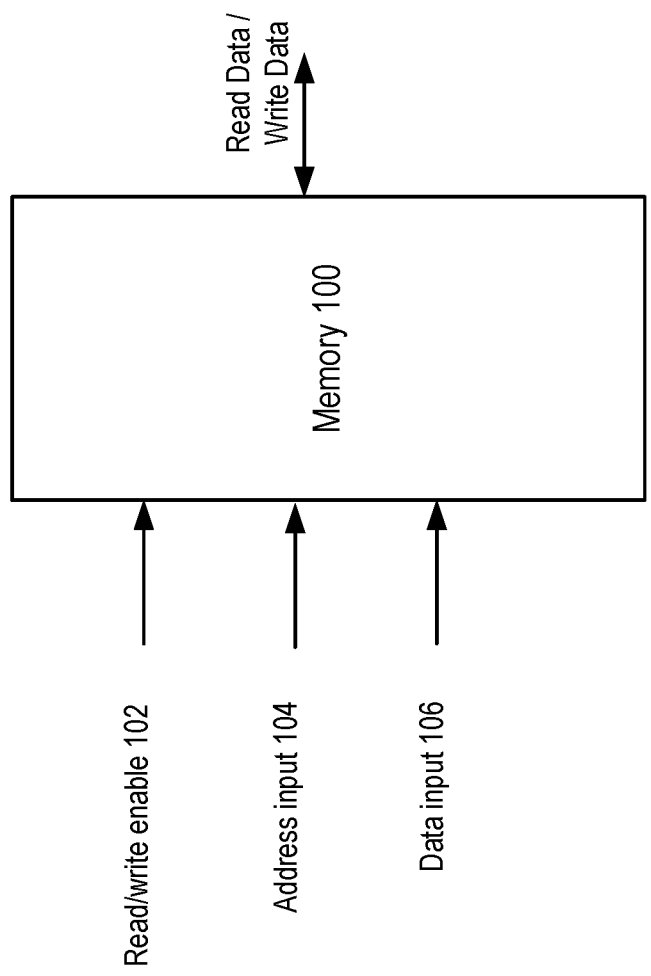
FIG. 1 is a block diagram of an exemplary embodiment of a memory.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

Various memories and methods for writing to memory presented throughout this disclosure may be incorporated within various apparatuses. By way of example, various aspects of memories disclosed herein may be implemented as or in a stand-alone memory. Such aspects may also be included in any integrated circuit (IC) or system, or any portion of an integrated circuit or system (e.g., modules, components, circuits, or the like residing in an integrated circuit or part of an integrated circuit), or any intermediate product where an integrated circuit or system is combined with other integrated circuits or systems (e.g., a video card, a motherboard, etc.) or any end product (e.g., mobile phone, personal digital assistant (PDA), desktop computer, laptop computer, palm-sized computer, tablet computer, work station, game console, media player, computer based simulators, wireless communication attachments for laptops, or the like). Various aspects of methods disclosed herein shall similarly be implemented in a stand-alone memory or included in any integrated circuit or system, or any portion of an integrated circuit or system, or any intermediate product or end product, or any step, process, algorithm, or the like, or any combination thereof performed by such stand-alone memory, integrated circuit or system (or portion thereof), intermediate product, or end product.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As used herein, two elements can be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the singular forms "a," "an" and "the" are intended to include the plural forms as well, unless the context clearly indicates otherwise. It will be further understood that the terms "comprises," "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. According all references to an SRAM is intended only to illustrate exemplary aspects of memory with the understanding that such aspects may be extended to a wide range of applications.

FIG. 1 is a block diagram of an exemplary embodiment of a memory. The memory 100 provides a medium for peripheral circuits to write and read data (e.g., program instructions and data operated by the instruction). As used hereinafter, the term "data" will be understood to include program instructions, data, and any other information that may be stored in the memory 100. The memory 100 includes an input for a read/write enable control 102 for controlling the read/write operation of the memory 100. The memory 100 also includes inputs for the address 104 and for write data to be written to the memory 100 at the specified address. The memory further includes an output for read data read from the memory 100 at the specified address. When writing data to the memory 100, a peripheral circuit sets the read/write enable control to the write mode and sends to the memory 100 the address along with the write data to be written to the memory 100 at that address. When reading data from the memory 100, the peripheral circuit sets the read/write enable control to the read mode and sends the address to the memory 100. In response, the memory 100 sends read data at that address to the peripheral circuit.

Figure 2:
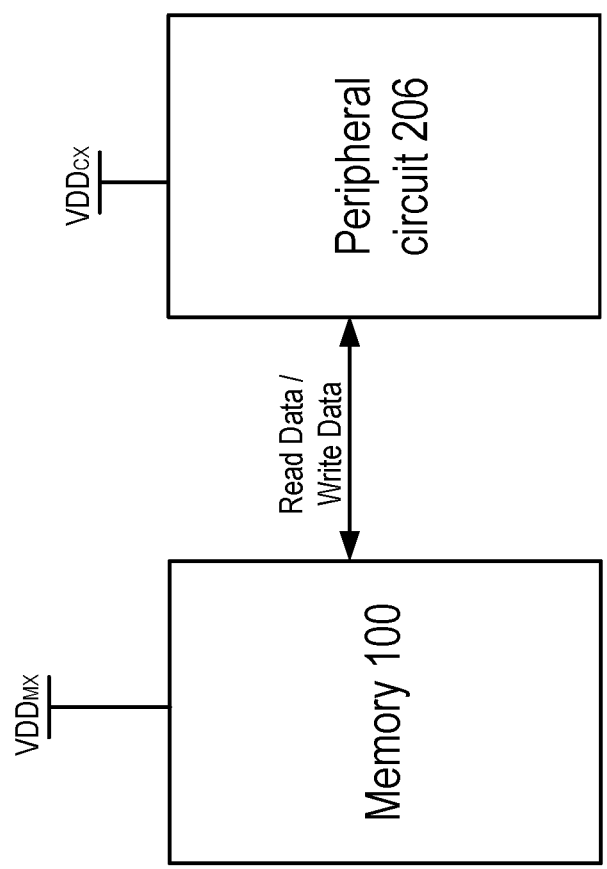
FIG. 2 is a block diagram of an exemplary embodiment of a peripheral circuit supported by a memory.

FIG. 2 is a block diagram of an exemplary embodiment of a peripheral circuit supported by a memory. The peripheral circuit 206 and memory 100 may be a system, or part of a larger system, that uses voltage scaling to meet power requirements. This may be achieved by using multiple voltage domains operating at different voltages. In some examples, a voltage domain may be a set or collection of operating voltages that include a voltage supply as the operating voltage and ground. By way of example, the peripheral circuit 206 may be configured to read data from or write data to the memory 100, which has a memory operating voltage $VDD_{MX}$ supplied from a first voltage supply (e.g., operating in the $VDD_{MX}$ voltage domain). The peripheral circuit 206, which operates from a second voltage supply $VDD_{CX}$ (e.g., operating in the $VDD_{CX}$ voltage domain), receives the read data and provides the write data. In some other examples, the memory 100 may also receive power from the second voltage supply $VDD_{CX}$ to interface to the peripheral circuit 206. At different times, the memory operating voltage $VDD_{MX}$ may be higher than or lower than the peripheral operating voltage $VDD_{CX}$ depending on the particular power requirements of the system. The peripheral circuit 206 is to be construed broadly to include any suitable circuit that is peripheral to the memory 100 and capable of accessing the memory 100.

Figure 3:
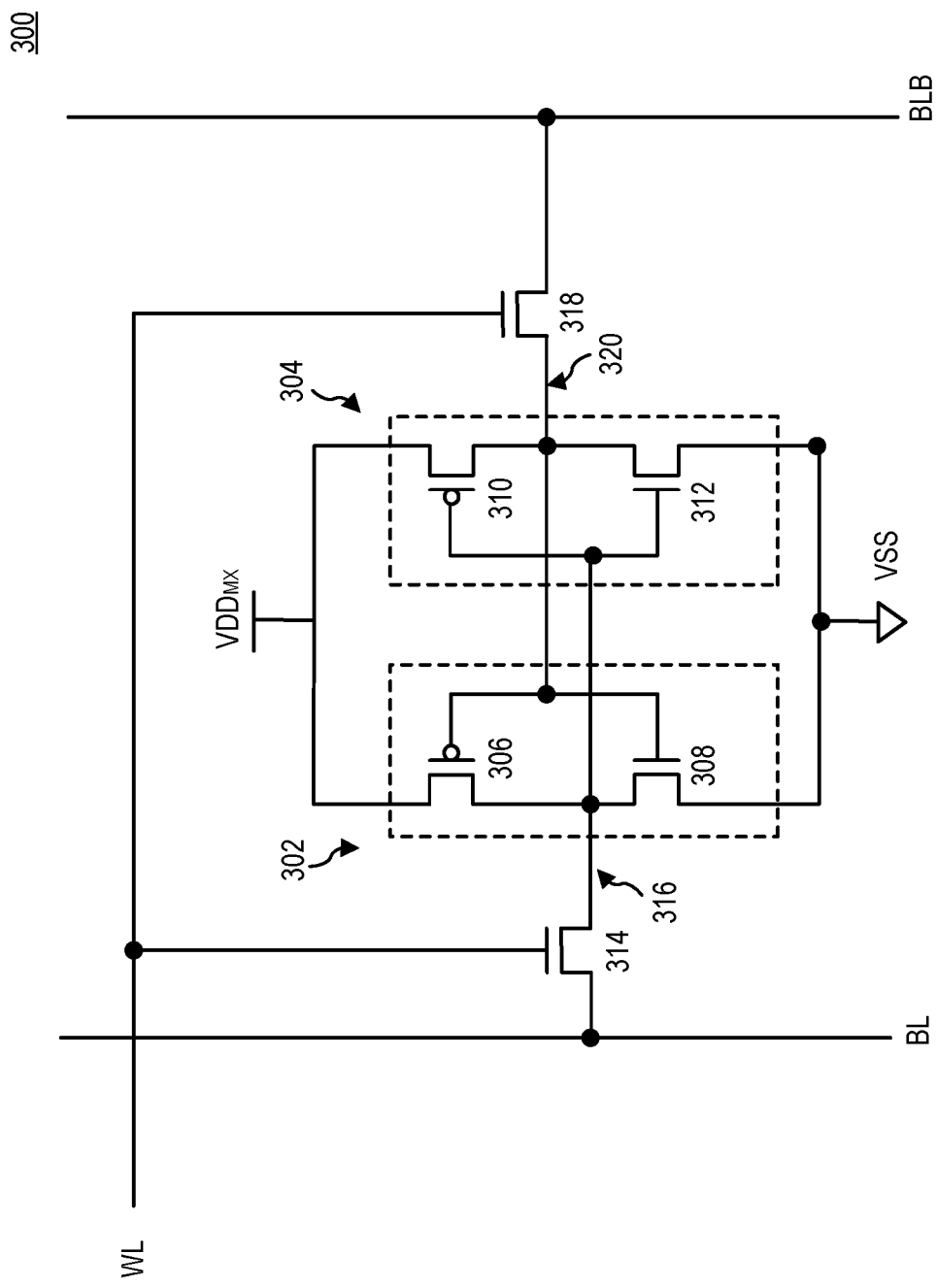
FIG. 3 is a schematic diagram of an exemplary embodiment of a memory cell for an SRAM.

The memory 100 may be any suitable storage medium, such as, by way of example, an SRAM. However, as those skilled in the art will readily appreciate, the memory 100 is not necessarily limited to SRAM. An SRAM includes an array of storage elements know as "cells," "memory cells," or "bitcells." Each memory cell is configured to store one bit of data (e.g., logic 1 or logic 0). FIG. 3 is a schematic diagram of an exemplary embodiment of a memory cell for an SRAM. The memory cell 300 is implemented with a six-transistor (6T) configuration. However, as those skilled in the art will readily appreciate, the cell may be implemented with a four-transistor (4T) or any other suitable transistor configuration.

The memory cell 300 is shown with two inverters 302, 304. The first inverter 302 comprises a p-channel transistor 306 and an n-channel transistor 308. The second inverter 304 comprises a p-channel transistor 310 and an n-channel transistor 312. In the described embodiment, the inverters 302 and 304 are powered by $VDD_{MX}$ and have a return VSS (e.g., ground). The memory cell 300 thus stores data in the $VDD_{MX}$ voltage domain. The first and second inverters 302, 304 are interconnected to form a cross-coupled latch. A first n-channel access transistor 314 couples the output node 316 from the first inverter 302 to a bitline BL, and a second n-channel access transistor 318 couples the output node 320 from the second inverter 304 to a bitline BLB (the value of which is the opposite or inverse of the bitline BL). The gates of the access transistors 314, 318 are coupled to a wordline WL.

A read operation may be initiated by precharging or charging the bitlines BL and BLB to a high level, which is determined so as not to disturb the stored data in the memory cell 300. In other words, the bitlines BL and BLB are precharged to a high level which does not flip the stored data. The wordline WL then is asserted, connecting the cross-coupled inverters 302, 304 to the bitlines BL and BLB via the access transistors 314 and 318, respectively. By way of example, the memory cell 300 may store the logic 1 by storing a low level (e.g., ground) at the output node 316 and a high level (e.g., $VDD_{MX}$) at the output node 320. These states are maintained by the cross-coupled inverters 302, 304. Upon asserting the wordline WL, the inverter 302 discharges the bitline BL through the access transistor 314 and the output node 316. The bitline BLB is maintained at the high level by the inverter 304 through the access transistor 318 and the output node 320. A voltage difference is thus established by the pulling-down of the bitline BL.

A write operation may be initiated by setting the bitlines BL and BLB to the value to be written to the memory cell 300 and asserting the wordline WL. That is, the write data are driven onto the bitlines BL and BLB. The wordline WL may be asserted before the value to be written (e.g., write data) is provided to the bitlines BL and BLB. By way of example, a logic 1 may be written to the memory cell 300 by setting the bitline BL to a logic level 0 and the bitline BLB to a logic 1. The logic level 0 at the bitline BL is applied to the input of the second inverter 304 through the access transistor 314, which in turn forces the output node 320 of the second inverter 304 to $VDD_{MX}$. The output node 320 of the second inverter 304 is applied to the input of the first inverter 302, which in turn forces the output node 316 of the first inverter 302 to VSS. A logic level 0 may be written to the memory cell 300 by inverting the values of the bitlines BL and BLB. The write driver (not shown) is designed to be stronger than the pull-up transistors (306 and 310) in the memory cell 300 so that it can override the previous state of the cross-coupled inverters 302, 304.

Once the read or write operation is complete, the wordline is deasserted, thereby causing the access transistors 314 and 318 to disconnect the bitlines BL and BLB from the two inverters 302, 304. The cross-coupling between the two inverters 302, 304 maintains the state of the inverter outputs as long as power is applied to the memory cell 300.

Figure 4:
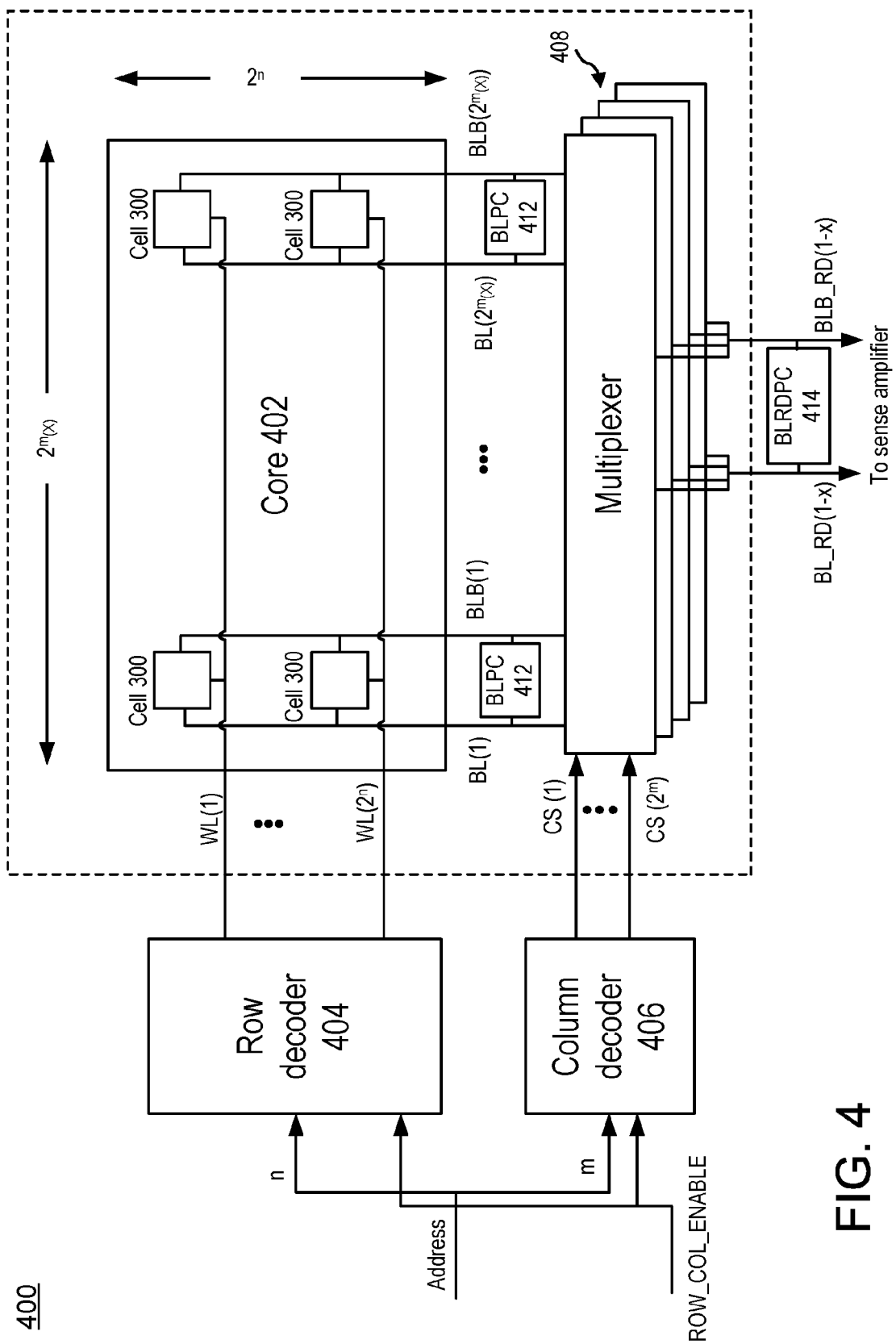
FIG. 4 is a functional block diagram of an exemplary embodiment of an SRAM.

FIG. 4 is a functional block diagram of an exemplary embodiment of an SRAM. Various aspects of the SRAM 400 will now be presented in the context of a read operation. Accordingly, for clarity of presentation, only the connections for the read operation are shown. Those skilled in the art will readily appreciate that additional connections are required to support the write operation.

The SRAM 400 includes a core 402 with supporting circuitry to decode addresses and perform read and write operations. The core 402 is comprised of memory cells 300 arranged to share connections in horizontal rows and vertical columns. Specifically, each horizontal row of memory cells 300 shares a wordline WL and each vertical column of memory cells 300 shares a pair of bitlines BL and BLB. The size of the core 402 (i.e., the number of cells) may vary depending on a variety of factors including the specific application, the speed requirements, the layout and testing requirements, and the overall design constraints imposed on the system. Typically, the core 402 will contain thousands or millions of memory cells.

In the exemplary embodiment of the SRAM shown in FIG. 4, the core 402 is made up of ($2^n \times 2^m(x)$) memory cells 300 arranged in $2^n$ horizontal rows and $2^m(x)$ vertical columns, where $2^m$ is the number of words per row and x is the number of bits outputted for a read access. A peripheral device (not shown) may randomly access any word (i.e., x cells) in the core 402 using an address that is (n+m) bits wide. In this example, n-bits of the address are provided to the input of a row decoder 404 and m-bits of the address are provided to the input of a column decoder 406. The column decoder 406 provides $2^m$ outputs column selects (CS(1)-CS($2^m$)) with a different one of the outputs asserted for each different combination of address inputs. The outputs are provided to x multiplexers 408. By way of example, the multiplexers 408 may include passgates. Each multiplexer may be $2^m$:1 multiplexer and selects one of $2^m$ bitline pairs read from the memory core 402 based on the outputs from the column decoder 406. With x multiplexers 408, x bits are selected and outputted for each read access. In some examples, the multiplexers 408 may be viewed as a $2^m$:1 selector. The selected x bitline pairs are outputted as bitline pairs BL_RD and BLB_RD.

The row decoder 404 converts the n-bit address into $2^n$ wordline outputs. A different wordline WL is asserted by the row decoder 404 for each different n-bit row address. As a result, each of the $2^m(x)$ memory cells 300 in the horizontal row with the asserted wordline WL is connected to one pair of the $2^m(x)$ bitlines BL and BLB through its access transistors as described above in connection with FIG. 3. The data stored in the memory cells are provide to the BL_RD and BLB_RD bitline pairs through the selected pairs of bitlines BL and BLB and the x multiplexers 408 with the asserted wordline WL, as described with FIG. 3. The BL_RD and BLB_RD bitline pairs are provided to sense amplifiers for amplification, and the resulting data of the amplification are outputted as read data.

In some examples, the row decoder 404 and the column decoder 406 may be enabled or disabled by the signal ROW_COL_ENABLE. In a case that the row decoder 404 and the column decoder 406 are disabled by the signal ROW_COL_ENABLE, no WLs and CS may be generated and no access of the memory cells 300 takes place.

Figure 5:
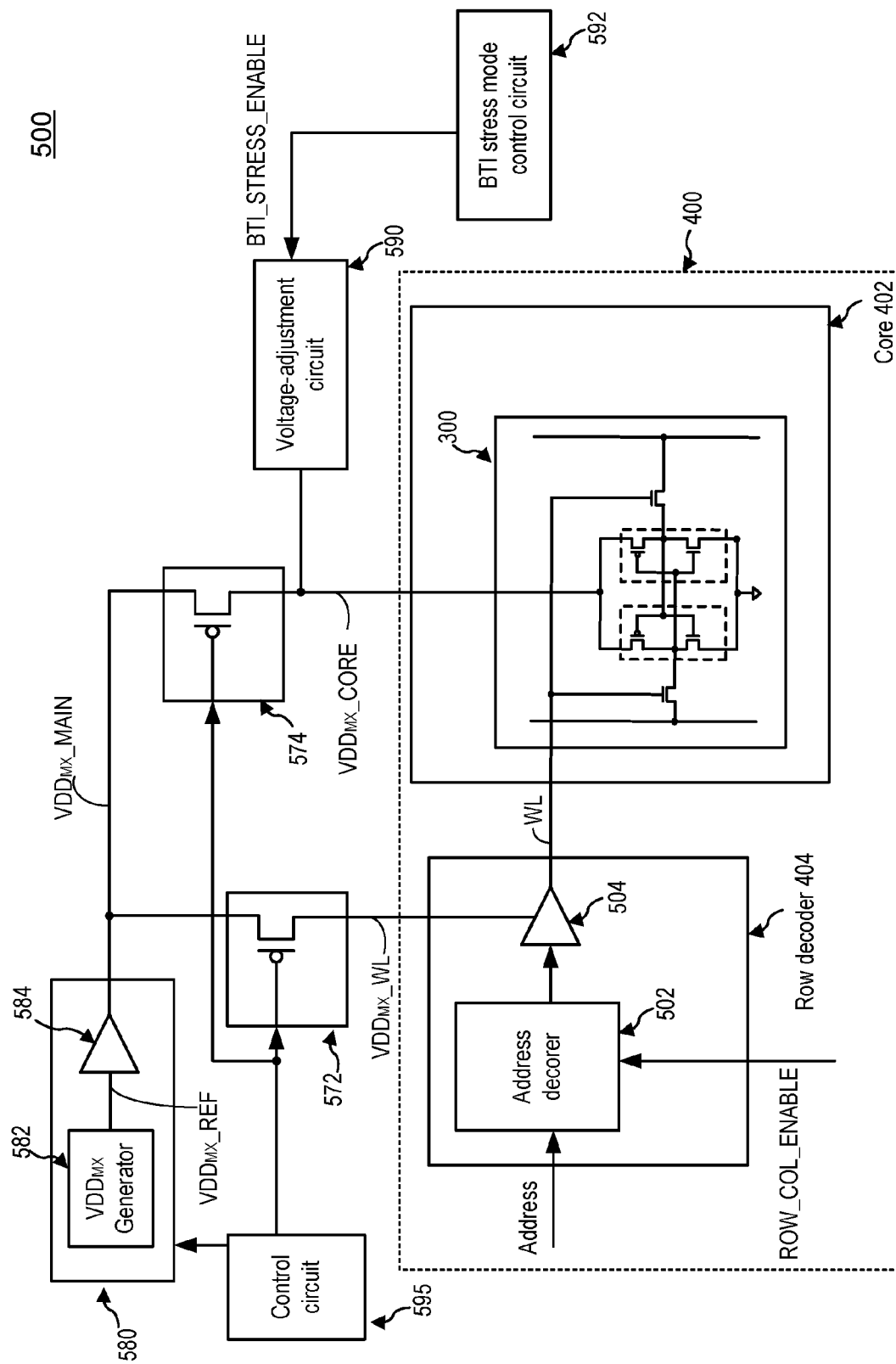
FIG. 5 is a block diagram of an exemplary embodiment of the SRAM of FIG. 4 and a voltage-adjustment circuit to operate a BTI stress mode.

FIG. 5 is a block diagram of an exemplary embodiment of the SRAM of FIG. 4 and a voltage-adjustment circuit to operate a BTI stress mode. Various aspects of apparatuses and methods to adjust the operating voltage $VDD_{MX}$ of the memory cells to perform BTI stress are provided below. However, as those skilled in the art will readily appreciate, the various aspects of methods and apparatus to adjust the operating voltage $VDD_{MX}$ for BTI stress throughout this disclosure and their numerous applications are not limited thereto. Accordingly, all references to a specific application for the presented apparatus or method are intended only to illustrate exemplary aspects of the apparatus or method with the understanding that such aspects may have a wide differential of applications.

The block diagram 500 illustrates an example of the row decoder 404 generating the wordline WL and providing the wordline WL to a memory cell 300 of the core 402. The row decoder 404 includes an address decoder 502 decoding the m row addresses, and provides the decoded result to the wordline driver 504. The wordline driver 504 is powered by the operating voltage $VDD_{MX}$_WL and provides the wordline WL as a $VDD_{MX}$_WL signal (when the wordline WL is activated). The memory cell 300 receives the wordline WL and reads/writes the data in the fashion described in FIG. 3. The memory cell 300 is powered by the operating voltage $VDD_{MX}$_CORE and stores data at that operating voltage in the fashion described in FIG. 3.

The operating voltage $VDD_{MX}$_WL and the operating voltage $VDD_{MX}$_CORE are provided to the SRAM 400 via two different power rails. For example, the wordline driver 504 receives the operating voltage $VDD_{MX}$_WL via the switch 572. The memory cell 300 receives the operating voltage $VDD_{MX}$_CORE via the switch 574. Both the operating voltage $VDD_{MX}$_WL and the operating voltage $VDD_{MX}$_CORE are provided from a voltage regulator 580

(e.g., a voltage supply circuit). An example of the voltage regulator 580 may include the power management integrated circuit (commonly known as PMIC). As an example, the voltage regulator 580 may include a $VDD_{MX}$ generator 582 that generates a $VDD_{MX}$ level reference voltage $VDD_{MX}$_REF. A driver 584 receives the reference voltage $VDD_{MX}$_REF and generates the operating voltage $VDD_{MX}$_MAIN, which is then provided to the switches 572 and 574. Since both the operating voltages $VDD_{MX}$_WL and $VDD_{MX}$_CORE receive the operating voltage $VDD_{MX}$_MAIN (via the switches 572 and 574, respectively), the operating voltages $VDD_{MX}$_WL and $VDD_{MX}$_CORE may be the same or substantially the same as the operating voltage $VDD_{MX}$_MAIN under normal read and write operations (e.g., non-test or non-stress modes). A control circuit 595 controls the voltage regulator 580 and/or the switches 572 and 574 and is configured to supply the operating voltage $VDD_{MX}$_MAIN to the memory cells 300 (as the operating voltage $VDD_{MX}$_CORE) and to the wordline driver 504 (as the operating voltage $VDD_{MX}$_WL). In some examples, the control circuit 595 may control the voltage regulator 580 and/or the switches 572 and 574 to provide a voltage range for the operating voltage $VDD_{MX}$_MAIN (e.g., to sweep the voltage range for the BTI stress mode discussed below). For example, if the normal operating voltage $VDD_{MX}$_MAIN is 1.0 V, the control circuit 595 may control the voltage regulator 580 and/or the switches 572 and 574 to provide 0.8 mV to 1.2 mV to sweep and to characterize the performance of the SRAM 400 over that voltage range (e.g., in the BTI stress mode).

A voltage-adjustment circuit 590 is coupled to the switch 574 and is configured to adjust the operating voltage $VDD_{MX}$_CORE supplied to the memory cells independent of the operating voltage $VDD_{MX}$_WL supplied to the wordline driver 504. A BTI stress mode control circuit 592 controls the voltage-adjustment circuit 590 via the BTI_STRESS_ENABLE signal. The BTI stress mode control circuit 592 selectively enables the voltage-adjustment circuit 590 based on an operating mode of the SRAM 400.

When the SRAM 400 operates in a regular mode (e.g., non-test or non-BTI-stress modes), the BTI stress mode control circuit 592 may deactivate the BTI_STRESS_ENABLE signal to turn off the voltage-adjustment circuit 590. Thus, in normal read/write operations, the operating voltages $VDD_{MX}$_WL and $VDD_{MX}$_CORE may be the same or substantially the same (as the operating voltage $VDD_{MX}$_MAIN). When the SRAM 400 operates in a BTI-stress mode, the BTI stress mode control circuit 592 may activate the BTI_STRESS_ENABLE signal to enable the voltage-adjustment circuit 590. The control circuit 595 controls the voltage regulator 580 and/or the switches 572 and 574 and is configured to supply the operating voltage $VDD_{MX}$_MAIN to the memory cells 300 (as the operating voltage $VDD_{MX}$_CORE) and to the wordline driver 504 (as the operating voltage $VDD_{MX}$_WL).

In the BTI stress mode, the memory cell 300 is operated or stressed to emulate the BTI effects (e.g., shifts in the threshold voltages $V_{TH}$ of the transistors). To achieve the stress, the voltage-adjustment circuit 590 may adjust the operating voltage $VDD_{MX}$_CORE to form a voltage difference between the operating voltage $VDD_{MX}$_CORE and the operating voltage $VDD_{MX}$_WL (which remains unadjusted and therefore, remains the same or substantially the same as the operating voltage $VDD_{MX}$_MAIN). Accordingly, in some examples, the voltage-adjustment circuit 590 is configured to adjust the operating voltage supplied to the memory cell 300 (e.g., $VDD_{MX}$_CORE) independent of the control circuit 595. The control circuit 595 continues to control the voltage regulator 580 and/or the switches 572 and 574 to supply the operating voltage $VDD_{MX}$_MAIN to the memory cells 300 (as the operating voltage $VDD_{MX}$_CORE without the adjustment) and to the wordline driver 504 (as the operating voltage $VDD_{MX}$_WL).

In some examples, the voltage-adjustment circuit 590 adjusts the operating voltage supplied to the memory cell 300 (e.g., $VDD_{MX}$_CORE) by pulling down on the operating voltage $VDD_{MX}$_CORE. The pulling-down emulates the BTI effect of increased $V_{TH}$ of the p-channel transistors (e.g., p-channel transistors 306 and 310 of the memory cell 300) by reducing the gate-to-source voltages of p-channel transistors (e.g., p-channel transistors 306 and 310). Further, BTI affects the p-channel transistors more than the n-channel transistors. By not adjusting the operating voltage $VDD_{MX}$_WL, the threshold voltage $V_{TH}$ of the n-channel, access transistors 314 and 318 remains unadjusted to emulate the lack of the BTI effect on the n-channel transistors.

As presented above, the operating voltage $VDD_{MX}$_CORE is adjusted by the voltage-adjustment circuit 590. Accordingly, when testing the SRAM 400 on a tester, the testing does not rely on the tester to produce the adjusted operating voltage $VDD_{MX}$_CORE. A tester requires substantial amount of time to adjust the provided voltages, and by adjusting the operating voltage $VDD_{MX}$_CORE internally, test time may be reduced.

Figure 6:
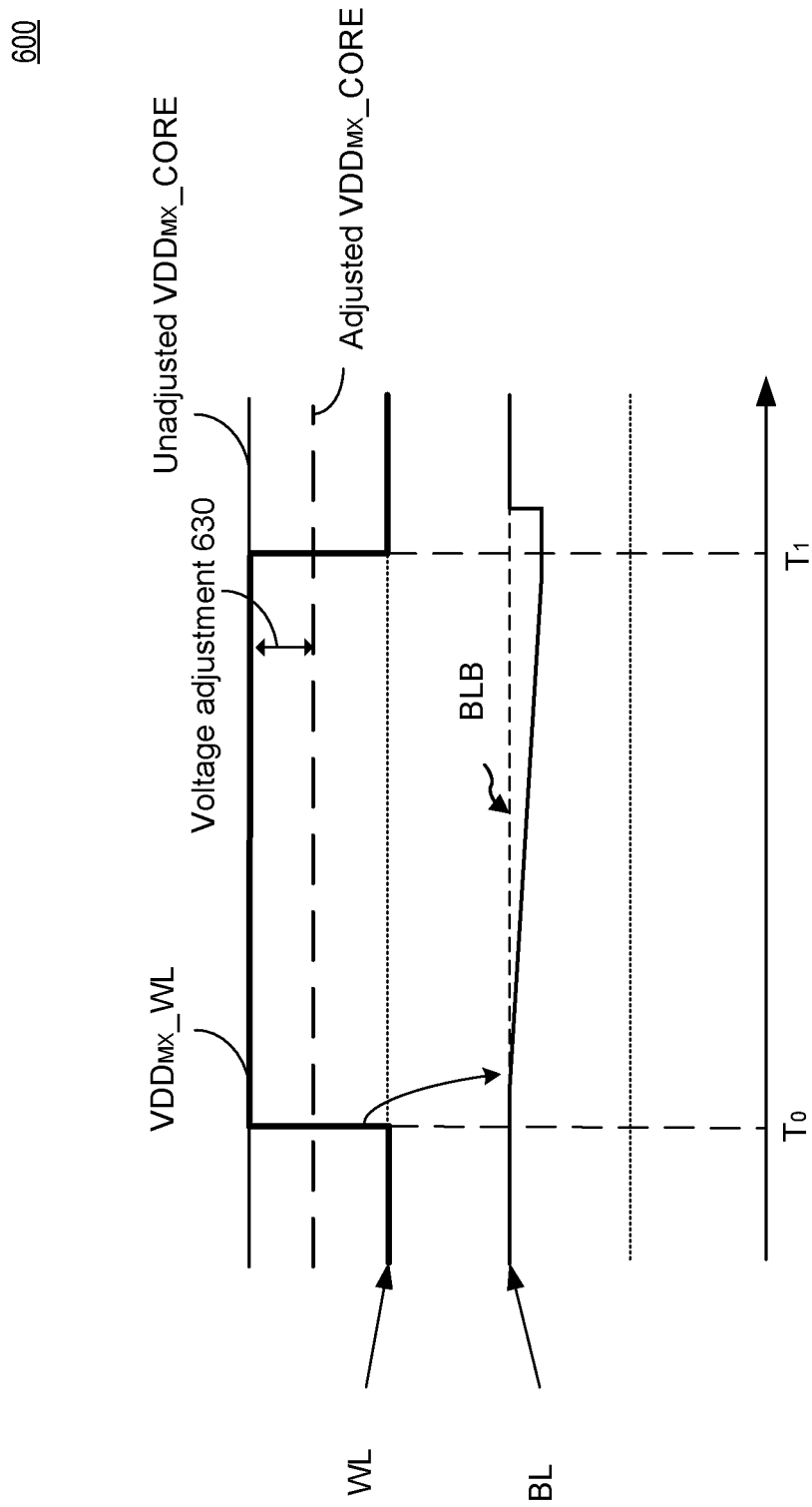
FIG. 6 is a timing diagram of a read access timing and relative voltage levels of the adjusted and unadjusted operating voltages.

FIG. 6 is a timing diagram of a read access timing and relative voltage levels of the adjusted and unadjusted operating voltages. A read operation is shown as an example. At $T_0$, the wordline driver 504 activates the wordline WL to the level of the operating voltage $VDD_{MX}$_WL. In a normal operation, the level of the operating voltage $VDD_{MX}$_WL is the same or substantially the same as the unadjusted operating voltage $VDD_{MX}$_CORE, as the voltage-adjustment circuit 590 is not enabled. In some examples, the level of the operating voltage $VDD_{MX}$_WL may be higher than the level of the operating voltage $VDD_{MX}$_CORE supplied to the memory cell 300 in a normal operation. In a BTI stress mode, the voltage-adjustment circuit 590 operates to pull down the operating voltage $VDD_{MX}$_CORE supplied to the memory cell 300, forming a voltage adjustment 630 (e.g., a voltage difference between the operating voltages $VDD_{MX}$_WL and the adjusted $VDD_{MX}$_CORE).

In response to the activation of the wordline WL at $T_0$, the data stored in the memory cell 300 is provided onto the bitline pair BL and BLB. A voltage differential is thereby developed on the bitline pair BL and BLB. At $T_1$, the wordline driver 504 deactivates the wordline WL to end the read access of the memory cell 300.

Figure 7:
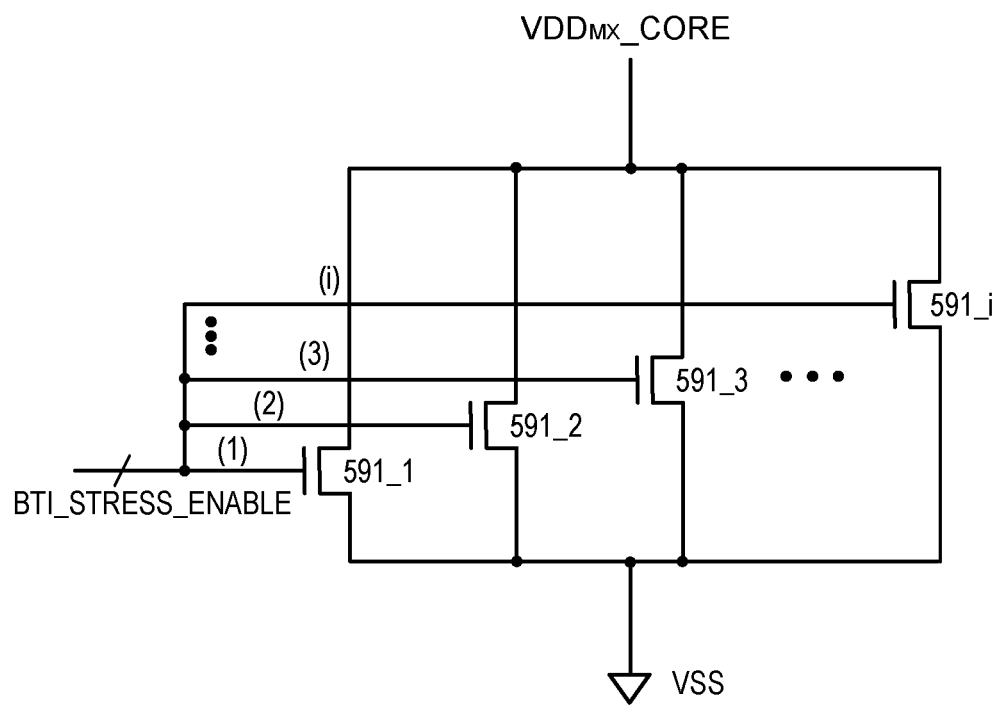
FIG. 7 is a circuit diagram of an exemplary embodiment of the voltage-adjustment circuit.

FIG. 7 is a circuit diagram of an exemplary embodiment of the voltage-adjustment circuit. The voltage-adjustment circuit 590 includes multiple n-channel transistors 591_1 to 591_i as pull-down devices. The n-channel transistors 591_1 to 591_i are arranged in parallel and coupled to the operating voltage $VDD_{MX}$_CORE and ground (VSS). The n-channel transistors 591_1 to 591_i are selectively turned on by the BTI_STRESS_ENABLE signal to adjust (e.g., pull down) the operating voltage $VDD_{MX}$_CORE. In a normal operation, the BTI stress mode control circuit 592 may deactivate the BTI_STRESS_ENABLE signal to turn off all the n-channel transistors 591_1 to 591_i. The operating voltage $VDD_{MX}$_CORE would thus remain unadjusted.

In the BTI stress mode, the BTI stress mode control circuit 592 may selectively turn on a number of the n-channel transistors 591_1 to 591_i to vary the voltage adjustment 630. As described above, the voltage adjustment 630 may be applied to emulate the BTI effect of $V_{TH}$ shift. The voltage adjustment 630 may thus be determined by studies of the BTI effect based on a time period in use and the $V_{TH}$ shift corresponding to the time period. The voltage adjustment 630 may thus be selected for the $V_{TH}$ shift of a target time period of usage. In this fashion, the BTI stress mode may screen out weak memory cells 300 subject to the BTI effect for the target time period.

Accordingly, as presented with FIGS. 5-7, the SRAM 400 may include a memory-access circuit configured to access the memory cell 300 in a first mode (e.g., a normal operation) with the control circuit 595 supplying a same operating voltage (e.g., $VDD_{MX}$_MAIN) to the memory cells 300 and to the wordline driver 504. A memory-access circuit may include any of the circuits that facilitate a read or write access to the memory cell 300. Examples of such may include the address decoder 502, the column decoder 406, or the multiplexer 408, etc. The memory-access circuit may be further configured to access the memory cell 300 in a second mode (e.g., the BTI stress mode) with the operating voltage supplied to the memory cells (e.g., $VDD_{MX}$_CORE) being adjusted lower than the operating voltage supplied to the wordline driver 504 (e.g., $VDD_{MX}$_WL).

Figure 8:
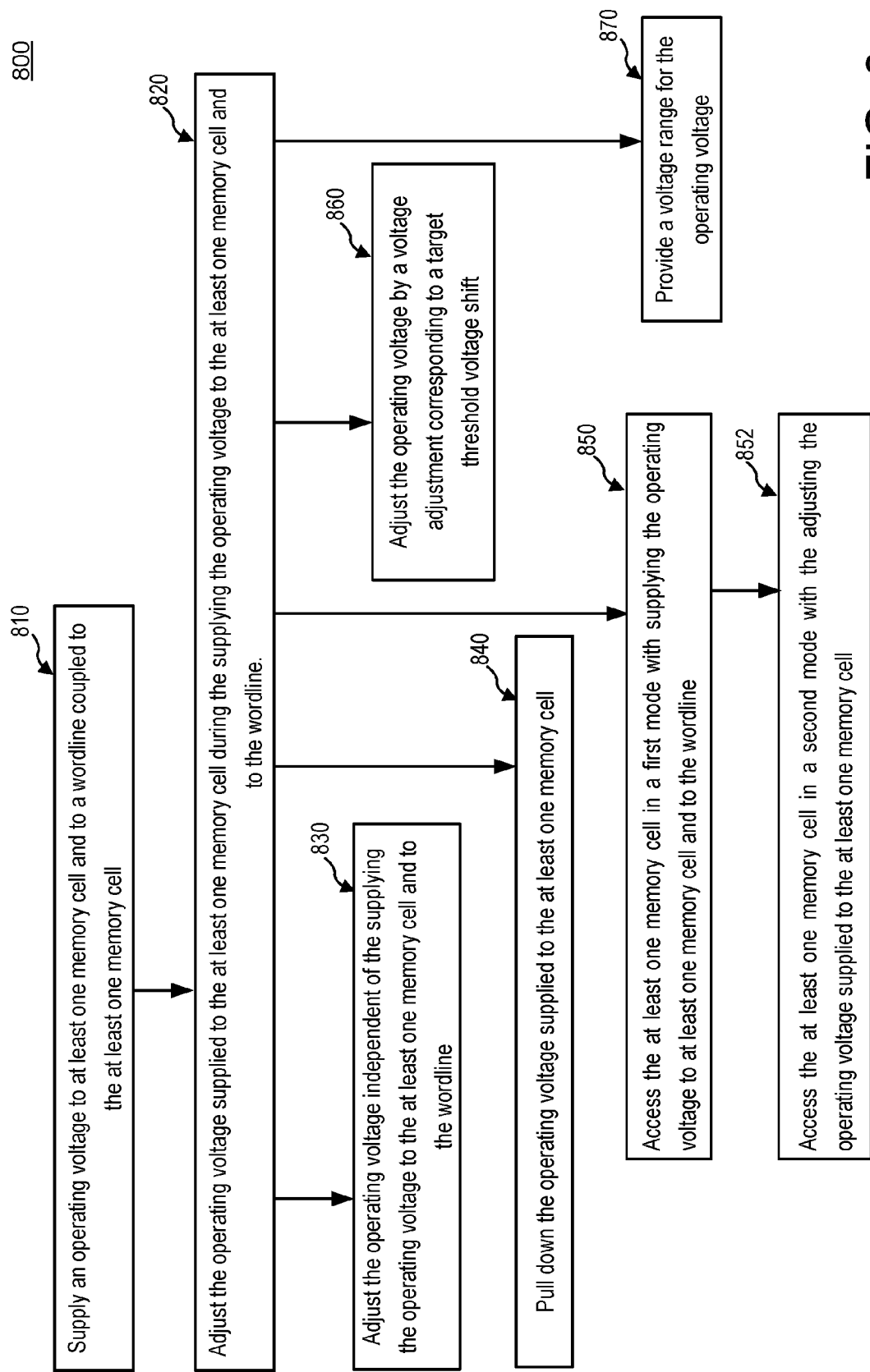
FIG. 8 is the flowchart of operations of an exemplary embodiment of the voltage-adjustment circuit.

FIG. 8 is the flowchart of operations of an exemplary embodiment of the voltage-adjustment circuit. The operations described may be performed by the SRAM 400 as presented with FIGS. 5-7. At 810, an operating voltage is supplied to at least one memory cell and to a wordline coupled to the at least one memory cell. Referring ti FIG. 5, the control circuit 595 provides the means to supply an operating voltage to the memory cells 300 and to the wordline driver 504.

The operating voltage $VDD_{MX}$_WL and the operating voltage $VDD_{MX}$_CORE are provided to the SRAM 400 via two different power rails. For example, the wordline driver 504 receives the operating voltage $VDD_{MX}$_WL via the switch 572. The memory cell 300 receives the operating voltage $VDD_{MX}$_CORE via the switch 574. Both the operating voltage $VDD_{MX}$_WL and the operating voltage $VDD_{MX}$_CORE are provided from a voltage regulator 580 (e.g., a voltage supply circuit). An example of the voltage regulator 580 may include the power management integrated circuit (commonly known as PMIC). As an example, the voltage regulator 580 may include a $VDD_{MX}$ generator 582 that generates a $VDD_{MX}$ level reference voltage $VDD_{MX}$_REF. A driver 584 receives the reference voltage $VDD_{MX}$_REF and generates the operating voltage $VDD_{MX}$_MAIN, which is then provided to the switches 572 and 574. Since both the operating voltages $VDD_{MX}$_WL and $VDD_{MX}$_CORE receive the operating voltage $VDD_{MX}$_MAIN (via the switches 572 and 574, respectively), the operating voltages $VDD_{MX}$_WL and $VDD_{MX}$_CORE may be the same or substantially the same as the operating voltage $VDD_{MX}$_MAIN under normal read and write operations (e.g., non-test or non-stress modes). A control circuit 595 controls the voltage regulator 580 and/or the switches 572 and 574 and is configured to supply the operating voltage $VDD_{MX}$_MAIN to the memory cells 300 (as the operating voltage $VDD_{MX}$_CORE) and to the wordline driver 504 (as the operating voltage $VDD_{MX}$_WL).

At 820, the operating voltage supplied to the at least one memory cell is adjusted during the supplying the operating voltage to the at least one memory cell and to the wordline. Referring to FIG. 5, the voltage-adjustment circuit 590 provides the means to adjust the operating voltage supplied to the of memory cells 300 during the control circuit 595 supplying the operating voltage to the memory cells 300 and the wordline driver 504.

At 830, the operating voltage is adjusted independent of the supplying the operating voltage to the at least one memory cell and to the wordline. For example, voltage-adjustment circuit 590 is coupled to the switch 574 and is configured to adjust the operating voltage $VDD_{MX}$_CORE supplied to the memory cells independent of the operating voltage $VDD_{MX}$_WL supplied to the wordline driver 504. A BTI stress mode control circuit 592 controls the voltage-adjustment circuit 590 via the BTI_STRESS_ENABLE signal. The BTI stress mode control circuit 592 selectively enables the voltage-adjustment circuit 590 based on an operating mode of the SRAM 400.

At 840, the operating voltage supplied to the at least one memory cell is pulled down. Referring to FIG. 7, in the BTI stress mode, the BTI stress mode control circuit 592 may selectively turn on a number of the n-channel transistors 591_1 to 591_i to vary the voltage adjustment 630. As described above, the voltage adjustment 630 may be applied to emulate the BTI effect of $V_{TH}$ shift. The voltage adjustment 630 may thus be determined by studies of the BTI effect including a time period in use and the $V_{TH}$ shift corresponding to the time period. The voltage adjustment 630 may thus be selected for the $V_{TH}$ shift of a target time period of usage. In this fashion, the BTI stress mode may screen out weak memory cells 300 subject to the BTI effect for the target time period.

At 850, the at least one memory cell is accessed in a first mode with supplying the operating voltage to at least one memory cell and to the wordline. At 852, the at least one memory cell is accessed in a second mode with the adjusting the operating voltage supplied to the at least one memory cell. In some examples, the SRAM 400 may include a memory-access circuit as an example of a means to access the memory cell 300. The memory-access circuit may access the memory cell 300 in a first mode (e.g., a normal operation) with the control circuit 595 supplying a same operating voltage (e.g., $VDD_{MX}$_MAIN) to the memory cells 300 and to the wordline driver 504. A memory-access circuit may include any of the circuits that facilitates a read or write access to the memory cell 300. Examples of such may include the address decoder 502, the column decoder 406, or the multiplexer 408, etc. The memory-access circuit may be further configured to access the memory cell 300 in a second mode (e.g., the BTI stress mode) with the operating voltage supplied to the memory cells (e.g., $VDD_{MX}$_CORE) being adjusted lower than the operating voltage supplied to the wordline driver 504 (e.g., $VDD_{MX}$_WL).

In the BTI stress mode, the memory cell 300 is operated or stressed to emulate the BTI effects (e.g., changes in the threshold voltages $V_{TH}$ of the transistors). To achieve the stress, the voltage-adjustment circuit 590 may adjust the operating voltage $VDD_{MX}$_CORE to form a voltage difference between the operating voltage $VDD_{MX}$_CORE and the operating voltage $VDD_{MX}$_WL (which remains unadjusted and therefore, remains the same or substantially the same as the operating voltage $VDD_{MX}$_MAIN). Accordingly, in some examples, the voltage-adjustment circuit 590 is configured to adjust the operating voltage supplied to the memory cell 300 (e.g., $VDD_{MX}$_CORE) independent of the control circuit 595. The control circuit 595 continues to control the voltage regulator 580 and/or the switches 572 and 574 to supply the operating voltage $VDD_{MX}$_MAIN to the memory cells 300 (as the operating voltage $VDD_{MX}$_CORE before the adjustment) and to the wordline driver 504 (as the operating voltage $VDD_{MX}$_WL).

In some examples, the voltage-adjustment circuit 590 adjusts the operating voltage supplied to the memory cell 300 (e.g., $VDD_{MX}$_CORE) by pulling down on the operating voltage $VDD_{MX}$_CORE. The pulling-down emulates the BTI effect of increased $V_{TH}$ of the p-channel transistors (e.g., p-channel transistors 306 and 310) by reducing the gate-to-source voltages of p-channel transistors. Further, BTI affects the p-channel transistors more than the n-channel transistors. By not adjusting the operating voltage $VDD_{MX}$_WL, the threshold voltage $V_{TH}$ of the n-channel, access transistors 314 and 318 remains unadjusted to emulate the lack of the BTI effect on the n-channel transistors.

At 860, the operating voltage is adjusted by a voltage adjustment corresponding to a target threshold voltage shift. In the BTI stress mode, the BTI stress mode control circuit 592 may selectively turn on a number of the n-channel transistors 591_1 to 591_i to vary the voltage adjustment 630. As described above, the voltage adjustment 630 may be applied to emulate the BTI effect of $V_{TH}$ shift. The voltage adjustment 630 may thus be determined by studies of the BTI effect including a time period in use and the $V_{TH}$ shift corresponding to the time period. The voltage adjustment 630 may thus be selected for the $V_{TH}$ shift of a target time period of usage. In this fashion, the BTI stress mode may screen out weak memory cells 300 subject to the BTI effect for the target time period.

At 870, a voltage range is provided for the operating voltage. The control circuit 595 controls the voltage regulator 580 and/or the switches 572 and 574 and is configured to supply the operating voltage $VDD_{MX}$_MAIN to the memory cells 300 (as the operating voltage $VDD_{MX}$_CORE) and to the wordline driver 504 (as the operating voltage $VDD_{MX}$_WL). In some examples, the control circuit 595 may control the voltage regulator 580 and/or the switches 572 and 574 to provide a voltage range for the operating voltage $VDD_{MX}$_MAIN (e.g., to sweep the voltage range for the BTI stress mode discussed above). For example, if the normal operating voltage $VDD_{MX}$_MAIN is 1.0 V, the control circuit 595 may control the voltage regulator 580 and/or the switches 572 and 574 to provide 0.8 mV to 1.2 mV to sweep and characterize the performance of the SRAM 400 over that voltage range (e.g., in the BTI stress mode).

In an exemplary embodiment, the various components presented above, such as the control circuit 595 and the BTI stress mode control circuit 592, may include circuits, processor or processors, software executing on the processor or processors, or combinations thereof. These components may include circuits for generating the signals for the functions described infra or signal lines carrying those signals.

By way of example, a component, or any portion of a component, or any combination of components may be implemented with one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

The specific order or hierarchy of blocks in the method of operation described above is provided merely as an example. Based upon design preferences, the specific order or hierarchy of blocks in the method of operation may be re-arranged, amended, and/or modified. The accompanying method claims include various limitations related to a method of operation, but the recited limitations are not meant to be limited in any way by the specific order or hierarchy unless expressly stated in the claims.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:

1. A memory, comprising:
   a plurality of memory cells;
   a wordline driver configured to output a wordline, the plurality of memory cells being coupled to the wordline;
   a control circuit configured to supply an operating voltage to the plurality of memory cells and to the wordline driver;
   a voltage-adjustment circuit configured to adjust the operating voltage supplied to the plurality of memory cells during the control circuit supplying the operating voltage to the plurality of memory cells and the wordline driver; and
   a memory-access circuit configured to:
      access at least one of the plurality of memory cells in a first mode with the control circuit supplying the operating voltage to the plurality of memory cells and to the wordline driver; and
      access the at least one of the plurality of memory cells in a second mode with the operating voltage supplied to the plurality of memory cells being adjusted lower than the operating voltage supplied to the wordline driver.

2. The memory of claim 1, wherein the voltage-adjustment circuit is further configured to adjust the operating voltage supplied to the plurality of memory cells independent of the operating voltage supplied to the wordline driver.

3. The memory of claim 1, wherein the voltage-adjustment circuit is further configured to adjust the operating voltage supplied to the plurality of memory cells independent of the control circuit.

4. The memory of claim 1, wherein the voltage-adjustment circuit comprises one or more pull-down devices configured to pull down the operating voltage supplied to the plurality of memory cells.

5. The memory of claim 4, wherein the voltage-adjustment circuit is further configured to selectively activate the one or more pull-down devices to vary an adjustment of the operating voltage supplied to the plurality of memory cells.

6. The memory of claim 1, wherein the control circuit is further configured to provide a voltage range for the operating voltage.

7. The memory of claim 1, wherein the voltage-adjustment circuit is further configured to adjust the operating voltage by a voltage adjustment corresponding to a target threshold voltage shift.

8. The memory of claim 1, wherein the voltage-adjustment circuit is selectively enabled based on an operating mode.

9. A method for operating a memory, comprising:
supplying an operating voltage to at least one memory cell and to a wordline coupled to the at least one memory cell;
adjusting the operating voltage supplied to the at least one memory cell during the supplying the operating voltage to the at least one memory cell and to the wordline;
accessing the at least one memory cell in a first mode with supplying the operating voltage to the at least one memory cell and to the wordline; and
accessing the at least one memory cell in a second mode with adjusting the operating voltage supplied to the at least one memory cell.

10. The method of claim 9, wherein the adjusting the operating voltage supplied to the at least one memory cell comprises adjusting the operating voltage independent of the supplying the operating voltage to the at least one memory cell and to the wordline.

11. The method of claim 9, wherein the adjusting the operating voltage supplied to the at least one memory cell comprises pulling down the operating voltage supplied to the at least one memory cell.

12. The method of claim 9, further comprising providing a voltage range for the operating voltage.

13. The method of claim 9, wherein the adjusting the operating voltage supplied to the at least one memory cell comprises adjusting the operating voltage by a voltage adjustment corresponding to a target threshold voltage shift.

14. The method of claim 9, wherein the adjusting the operating voltage supplied to the at least one memory cell is selectively enabled based on an operating mode.

15. A memory, comprising:
a plurality of memory cells;
a wordline driver configured to output a wordline, the plurality of memory cells being coupled to the wordline;
a first power rail and a second power rail;
a voltage supply circuit configured to supply an operating voltage to the plurality of memory cells via the first power rail and to the wordline driver via the second power rail;
a voltage-adjustment circuit coupled to the first power rail to adjust the operating voltage supplied to the plurality of memory cells in accordance with a target threshold voltage shift; and
a memory-access circuit configured to:
access at least one of the plurality of memory cells in a first mode with the voltage supply circuit supplying the operating voltage to the plurality of memory cells and to the wordline driver; and
access the at least one of the plurality of memory cells in a second mode with the voltage-adjustment circuit adjusting the operating voltage supplied to the plurality of memory cells lower than the operating voltage supplied to the wordline driver.

16. The memory of claim 15, wherein the voltage-adjustment circuit is further configured to adjust the operating voltage supplied to the plurality of memory cells independent of the operating voltage supplied to the wordline driver.

17. The memory of claim 16, wherein the voltage-adjustment circuit comprises one or more pull-down devices configured to pull down the operating voltage supplied to the plurality of memory cells.

18. The memory of claim 17, wherein the voltage-adjustment circuit is further configured to selectively activate the one or more pull-down devices to vary the adjustment of the operating voltage supplied to the plurality of memory cells.

19. The memory of claim 15, wherein the voltage supply circuit is further configured to provide a voltage range for the operating voltage.

20. The memory of claim 15, wherein the voltage-adjustment circuit is selectively enabled based on an operating mode.

21. A memory, comprising:
means for supplying an operating voltage to at least one memory cell and to a wordline coupled to the at least one memory cell;
means for adjusting the operating voltage supplied to the at least one memory cell during the supplying the operating voltage to the at least one memory cell and to the wordline; and
means for accessing the at least one memory cell in a first mode with supplying the operating voltage to the at least one memory cell and to the wordline, and for accessing the at least one memory cell in a second mode with adjusting the operating voltage supplied to the at least one memory cell.

22. The memory of claim 21, wherein the means for adjusting the operating voltage supplied to the at least one memory cell further adjusts the operating voltage independent of the supplying the operating voltage to the at least one memory cell and to the wordline.

23. The memory of claim 21, wherein the means adjusting the operating voltage supplied to the at least one memory cell further pulls down the operating voltage supplied to the at least one memory cell.

24. The memory of claim 21, wherein the means for adjusting the operating voltage supplied to the at least one memory cell further provides a voltage range for the operating voltage.

25. The memory of claim 21, wherein the means for adjusting the operating voltage supplied to the at least one memory cell further adjusts the operating voltage by a voltage adjustment corresponding to a target threshold voltage shift.

26. The memory of claim 21, wherein the means for adjusting the operating voltage supplied to the at least one memory cell is selectively enabled based on an operating mode.

* * * * *